United States Patent [19]

Koe et al.

[11] Patent Number: 4,574,950

[45] Date of Patent: Mar. 11, 1986

[54] WAFER BOX

[75] Inventors: Kiyohiko Koe; Jun Yamaguchi; Noboru Kubo, all of Hyogo; Hiroshi Matsumoto, Osaka; Mamoru Sugimoto, Osaka; Keiji Fukumura, Osaka, all of Japan

[73] Assignee: Sumitomo Electric Industries, Ltd., Japan

[21] Appl. No.: 602,590

[22] Filed: Apr. 20, 1984

[30] Foreign Application Priority Data

Apr. 25, 1983 [JP] Japan ................. 58-72701

[51] Int. Cl.⁴ ............... B65D 85/30; B65D 5/48
[52] U.S. Cl. ............... 206/334; 206/454; 206/499; 211/41; 220/22
[58] Field of Search .......... 220/22.1, 20, 22; 206/454, 455, 456, 310, 370, 334, 328, 499; 211/41

[56] References Cited

U.S. PATENT DOCUMENTS

| | | | |
|---|---|---|---|
| 2,884,154 | 4/1959 | Hobson | 220/22.1 |
| 3,954,202 | 5/1976 | Petrick | 220/22.1 |
| 4,043,451 | 8/1977 | Johnson | 206/454 |
| 4,160,504 | 7/1979 | Kudlich et al. | 206/453 |
| 4,248,348 | 2/1981 | Johnson | 206/454 |
| 4,427,114 | 1/1984 | Howell et al. | 206/454 |
| 4,446,966 | 5/1984 | Moloney | 206/454 |

FOREIGN PATENT DOCUMENTS 2413281 12/1977 France ................. 220/22.1

Primary Examiner—Joseph Man-Fu Moy
Attorney, Agent, or Firm—Sughrue, Mion, Zinn, Macpeak and Seas

[57] ABSTRACT

A wafer box having a variable wafer slot size including a wafer box body of a rectangular parallelpiped shape having parallel wafer inserting grooves formed in inner side surfaces thereof extending in a vertical direction, a plurality of parallel fixing plate inserting grooves formed in the end surfaces and extending in a vertical direction, and an open upper part. At least one fixing plate, also having a plurality of wafer receiving grooves formed on at least one surface thereof, is inserted into a selected pair of the fixing plate inserting grooves. Both ends of the plate are shaped so as to be easily insertable and removable. Buffer members are placed between the side surfaces in the upper and lower portions of the box to support the wafers from the upper and lower sides thereof. A closure covers the upper part of the box.

7 Claims, 7 Drawing Figures

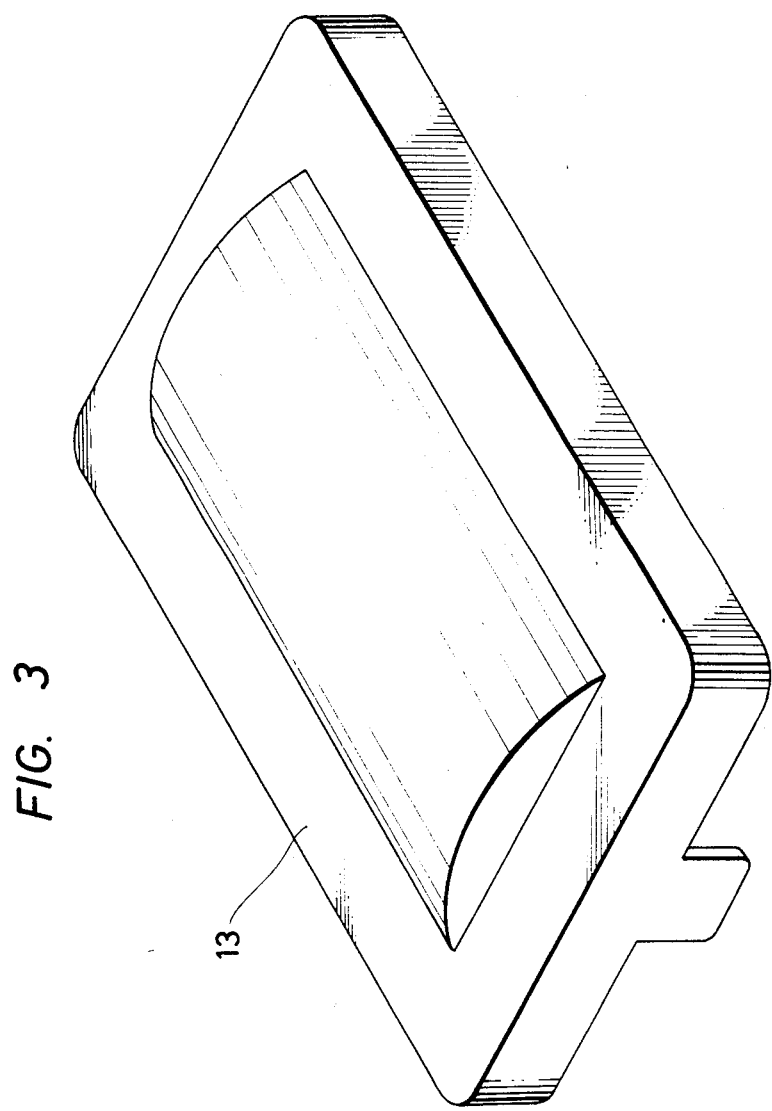

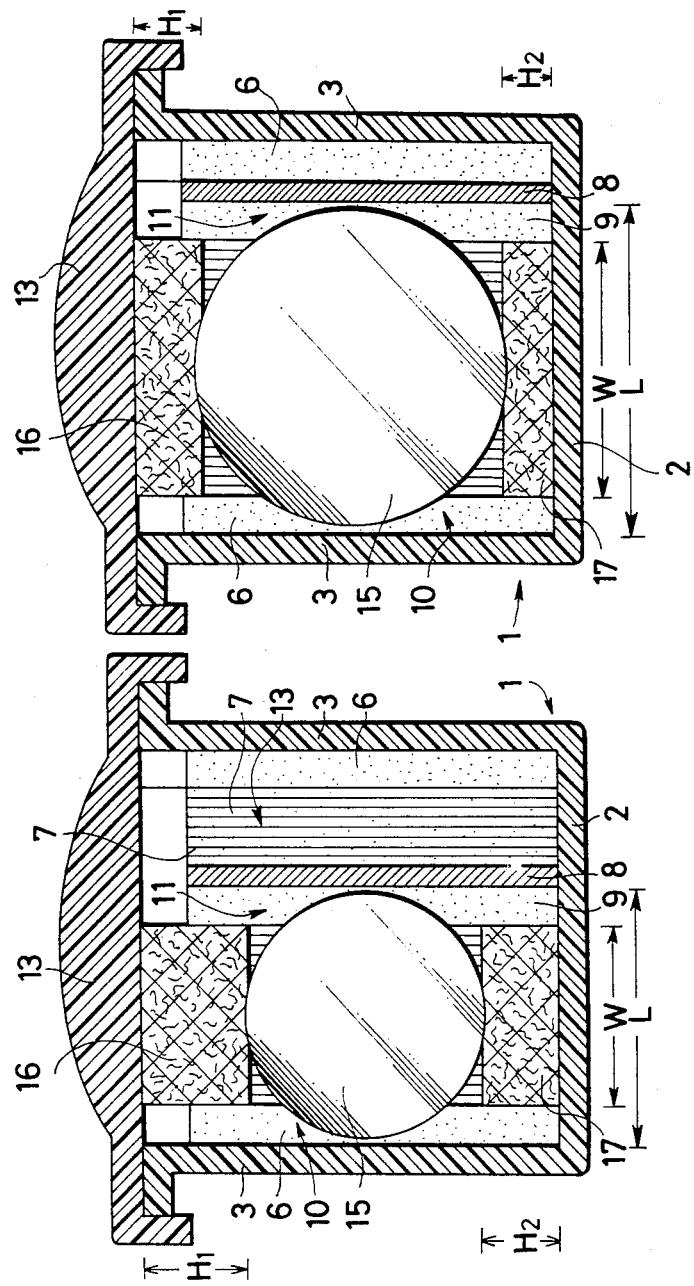

WAFER BOX

BACKGROUND OF THE INVENTION

The present invention relates to a wafer box for receiving and holding large numbers of single-crystal semiconductor wafers, in particular, compound single-crystal wafers.

Single-crystal semiconductor wafers must be maintained separated from one another when being stored or transported. Silicon wafers are generally circular in shape and standardized in size, and hence it is possible to standardize the shape and size of containers for storing silicon wafers. A wafer box such as shown in FIG. 1 is known for this purpose.

With reference to FIG. 1, semicircular thin grooves are formed at regular intervals on both side surfaces in the longitudinal direction of a wafer box body of a rectangular parallelpiped shape having an opening at the upper part. A resilient grooved supporting member is provided at the bottom of the body.

A wafer can be inserted into each of the grooves, the side parts of the wafer being held by the grooves and the lower part being supported by the grooved supporting member. The upper part of the wafer is supported by a resilient grooved supporting member located on the lower surface of a closure covering the wafer box body. The illustrated wafer box is widely used in the case of silicon wafers of standardized shape and size as mentioned above. As silicon wafers have some inherent strength, little damage occurs during storage or transportation of the wafer box.

Recently, various kinds of compound semiconductor single-crystal wafers have been developed. These compound wafers generally have a much lower mechanical strength than silicon wafers. Furthermore, the processes and conditions for growing various crystals are different due to the different components of the crystals, and the conditions for cutting an ingot into wafers are also different. Therefore, the size of compound wafers is not yet standardized and wafers of various shapes and sizes are currently being manufactured. In addition, a compound wafer often requires a higher degree of cleanliness than a silicon wafer. Accordingly, it has become difficult to use a conventional wafer box intended for use with silicon wafers with compound wafers. That is to say, it has been found that it is necessary to provide wafer boxes corresponding to the specific shapes and sizes of the various wafers. Nevertheless, a significant amount of damage can still occur. This has been dealt with by using individual thin, dish-shaped containers, which practice is inefficient and costly.

Thus, it is an object of this invention to provide a wafer box which can receive wafers of different shapes and sizes but with which the wafers are not damaged during receiving, taking out and transportation, even if the wafers received in the box are compound semiconductor crystal wafers.

SUMMARY OF THE INVENTION

A wafer box according to the invention has a construction as follows: One side of a wafer to be received is retained by one of plural vertical grooves which are located on the inner side surface of at least one side of a wafer box body of a rectangular parallelpiped shape. The other side of the wafer is retained by one of the vertical grooves on at least one surface of a fixing plate which is detachably inserted at a position depending on the size of the wafer.

The interval between the inner side surface and the fixing plate is adjusted by changing the inserting position of the fixing plate for a number of vertical grooves which are located on both sides, neither of which is opposed to the inner side surface.

Buffer members are provided on the bottom part and the upper part of the wafer box body between the inner side surface and the fixing plate to hold the lower part and the upper part of the wafer. The buffer members change thickness or width depending on the sizes of the wafers, and the thickness is made such that the buffer members are slightly compressed when the box body is covered with a closure. In addition, as the fixing plate, there is employed a plate having a shape such that it lightly touches the inner surface of the closure when the box body is covered with the closure.

BRIEF DESCRIPTION OF THE DRAWINGS

FIG. 3 is a perspective view of a closure for the box of FIG. 2;

FIG. 4 is a longitudinal sectional view of the wafer box containing small wafers;

FIG. 5 is a longitudinal sectional view of the wafer box containing large wafers;

DESCRIPTION OF THE PREFERRED EMBODIMENTS

Figure 1:
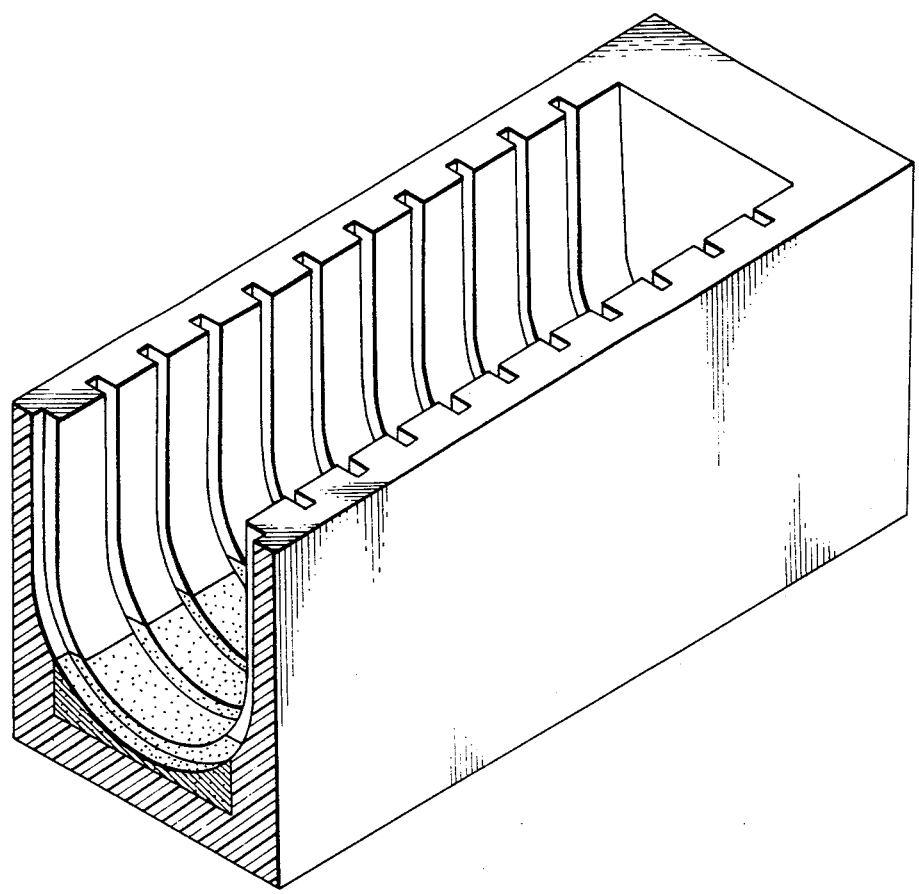
FIG. 1 is a partially cross-sectional perspective view of a conventional wafer box.
Figure 2:
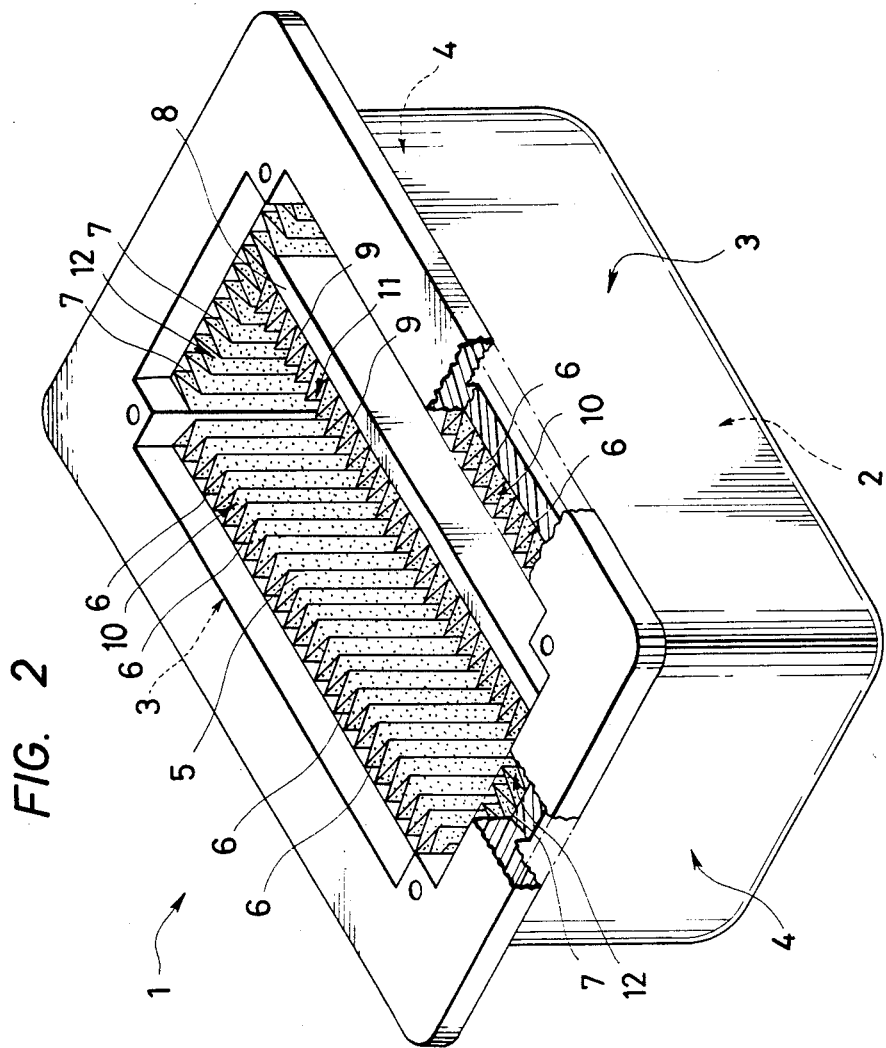
FIG. 2 is a perspective view illustrating a wafer box of the invention.

FIG. 2 is a perspective view of a wafer box body, and FIG. 3 is a perspective view of a closure constructed in accordance with the invention. In FIG. 2, 1 is a plastic wafer box body of rectangular parallelpiped shape, of which five of the six sides are enclosed by a bottom 2, sides 3 extending in the longitudinal direction, and front and rear ends 3 and 4, respectively. The upper part 5 is open. Wafers are received in the wafer box body 1 from the open upper part 5.

A number of triangular vertical supporting members 6 are provided in parallel at equal intervals on the inner surfaces of the sides 3, and triangular vertical supporting members 7 are provided in parallel on the inner side of the ends 4. The vertical supporting members 6 and 7 may be made from a separate material bonded to the inner surfaces of the sides 3 and ends 4, or they can be formed integrally with the wafer box body 1 using an injection molding technique.

Reference numeral 8 indicates an insertable fixing plate, which is a flat board having a height substantially equal to that of the wafer box body 1. Both ends of the plate 8 are triangularly shaped so as to be insertable into fixing plate inserting grooves 12 in the vertical supporting members 7. Moreover, triangular vertical supporting members 9 having the same shape as that of the vertical supporting members 6 are provided at the same intervals as the supporting members 6.

Wafers can be inserted into slots formed by wafer receiving grooves 10 in the vertical supporting members 6 and wafer inserting grooves 11 in the vertical supporting members 9 located opposite one another by inserting the fixing plate 8 into an appropriate pair of fixing plate inserting grooves 12.

In FIG. 4, 15 designates a circular wafer inserted into a pair of wafer inserting grooves 10 and 11 and supported by vertical supporting members 6 and 9.

Buffer members 16 and 17, made of a soft foam such as polyurethane foam or the like, are provided at the upper and lower sides of the wafer 15. The buffer members 16 and 17 are rectangular parallelpiped in shape and have a shorter side which is substantially equal in length to the distance between the tips of the vertical supporting members 6 and 9 and a longer side which is substantially equal in length to the distance between the tips of the vertical supporting members 7 on both sides. The thickness is substantially equal to a value obtained by subtracting the height of the wafer 15 from the height of the wafer box body 1, appropriately divided proportionally. As mentioned above, the size of buffer members 16 and 17 varies depending on the size and shape of the wafers to be received. For the purpose of maintaining the cleanliness of the container, it is preferred to use a buffer material which has been enclosed in a film of vinyl or the like.

Further in FIGS. 4 and 5, 13 is a closure for closing the opening part 5 in the wafer box body 1, which is closely fitted on the upper part of the wafer box body 1 by a fixing device (not shown). The inner side of the closure 13 is flat and constructed so that the flat surface lightly presses the buffer member 16 and the inserted fixing plate 8 downwardly.

With the wafer box according to the invention constructed as described above, it is possible to use the same wafer box for wafers of different sizes by changing the position of the fixing plate 8 in the fixing plate inserting grooves 12. Respective positions for two wafers of different sizes are illustrated in FIGS. 4 and 5.

Figure 6:
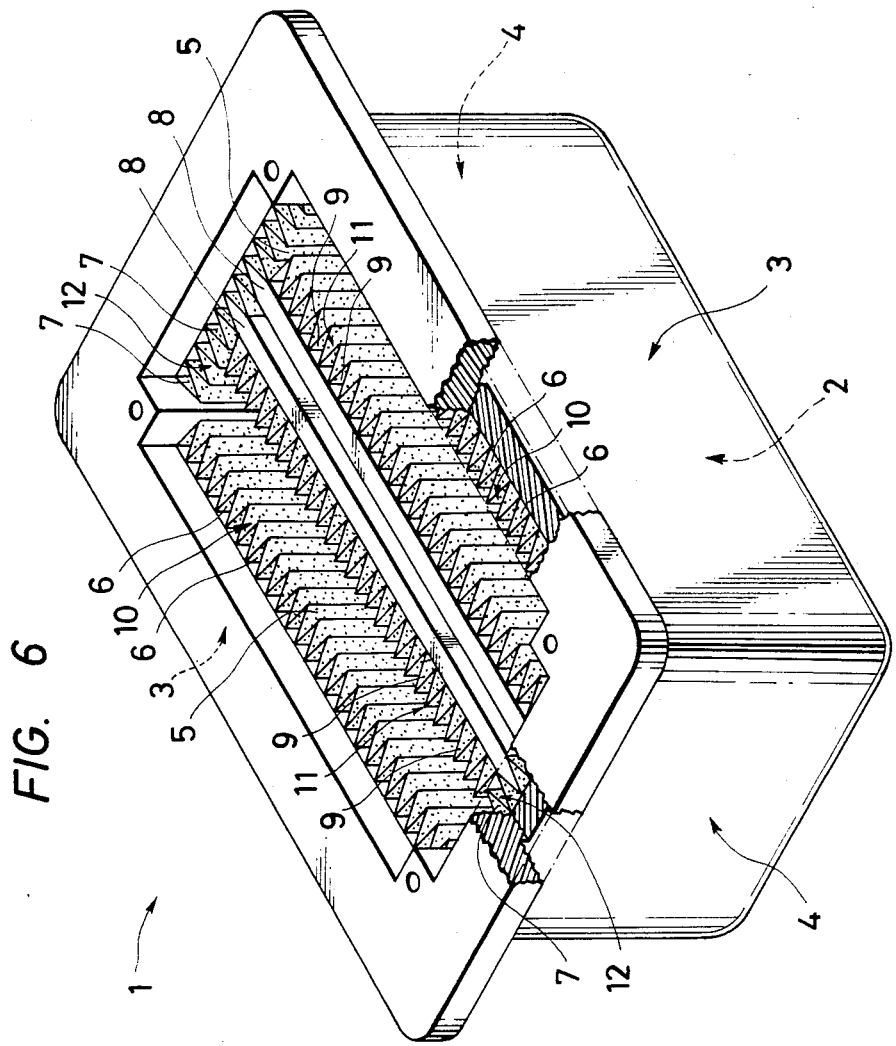
FIG. 6 is a perspective view illustrating a modified example of the wafer box.
Figure 7:
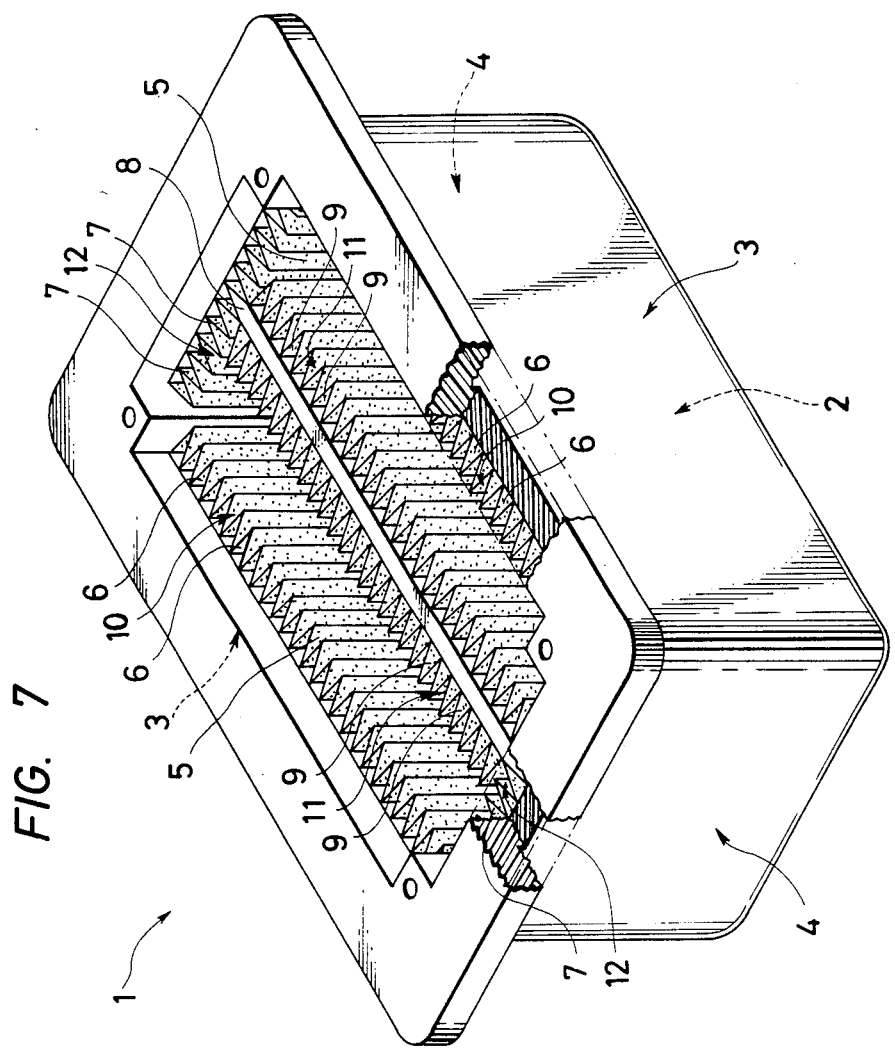
FIG. 7 is a perspective view illustrating another modified example of the wafer box.

FIGS. 6 and 7 show modifications, of which FIG. 6 shows an example of using two inserted fixing plates 8, and FIG. 7 an example of providing wafer inserting grooves 11 on both sides of a single inserted fixing plate 8.

According to this invention, it is possible to receive wafers having different shapes and sizes in the same wafer box, so long as the wafers are not larger than the wafer box body, by altering the position of the fixing plate 8 or appropriately altering the size of the buffer members at the upper and lower parts. Even if the wafer to be received is made of a compound semiconductor material such as GaAs, GaP, InP, InSb, InAs, GaSb or the like, it will not be damaged.

Test Examples (1) Twenty-five pieces of mirror-faced GaAs wafers of $50\pm1$ mm $\phi$ were packed in a wafer box of the invention. This wafer box was sent by mail for 30 round trips between Itami City in Hyogo Prefecture Japan and Tokyo, a distance of several hundred kilometers. No breakage or strain was found.

(2) Similar tests were carried out also for a wafer box in which 25 mirror-faced InP wafers of $40\pm1$ mm $\phi$ were packed. In this case too, no breakage, strain or the like was found.

(3) Similar tests were repeated also for rectangular mirror-faced GaAs wafers of $40\times45$ mm, and it was confirmed that no breakage, strain or the like was produced.

We claim:

1. A wafer box comprising:
    a wafer box body of a rectangular parallelpiped shape having a plurality of parallel wafer inserting grooves formed in inner side surfaces thereof extending in a vertical direction, a plurality of parallel fixing plate inserting grooves formed in inner end surfaces thereof extending in a vertical direction, and an open upper part;
    at least one fixing plate having a plurality of wafer receiving grooves formed on at least one side thereof, both ends of said at least one plate being shaped so as to be detachably insertable into a selected pair of said fixing plate inserting grooves in said wafer box body;
    first and second buffer members respectively received between said side surfaces of said wafer box body and said at least one fixing plate to support wafers received in said box from upper and lower sides thereof; and
    a closure for covering said upper part.

2. The wafer box according to claim 1, wherein said buffer members are made of a soft foam enclosed in a plastic film.

3. The wafer box according to claim 1, wherein said buffer members are made of silicone rubber.

4. The wafer box according to claim 1, wherein said buffer members comprise plastic plates having grooves formed therein for receiving upper and lower edges of wafers received in said box.

5. The wafer box according to claim 1, wherein said at least one fixing plate comprises a single fixing plate having said receiving grooves formed on one surface thereof.

6. The wafer box according to claim 1, wherein said at least one fixing plate comprises a pair of fixing plates, each having ones of said wafer receiving grooves formed on one side thereof, said fixing plates being inserted into respective pairs of said fixing plate inserting grooves with said wafer receiving grooves on opposite sides thereof.

7. The wafer box according to claim 1, wherein said at least one fixing plate comprises a single fixing plate having ones of said wafer receiving grooves formed on both sides thereof, whereby wafers can be received on both sides of said fixing plate.

* * * * *